United States Patent [19]
Suzuki

[11] Patent Number: 5,946,250
[45] Date of Patent: Aug. 31, 1999

[54] MEMORY TESTING APPARATUS

[75] Inventor: Toshikazu Suzuki, Tokyo, Japan

[73] Assignee: Advantest Corporation, Tokyo, Japan

[21] Appl. No.: 09/252,634

[22] Filed: Feb. 19, 1999

[30] Foreign Application Priority Data

Feb. 20, 1998 [JP] Japan .................................. 10-038301

[51] Int. Cl.⁶ .................................................. G11C 7/00
[52] U.S. Cl. .......................................... 365/201; 365/200
[58] Field of Search ................................... 365/201, 200; 371/10.2, 10.3, 21.1, 21.2

[56] References Cited

U.S. PATENT DOCUMENTS 5,835,429  11/1998  Schwarz .................................. 365/201
5,859,804   1/1999  Hedberg et al. ........................ 365/201

Primary Examiner—Vu A. Le
Attorney, Agent, or Firm—Gallagher & Lathrop; David N. Lathrop

[57] ABSTRACT

There is provided a memory testing apparatus having, for a high speed device testing, a failure data display controller for memory test including a display apparatus for displaying positions of failure memory cells based on failure data obtained by testing of a memory.

After the test is completed, the failure data stored in a failure memory for storing failure data are transferred to a failure buffer memory for temporarily storing failure data provided in the failure data display controller. The failure data stored in the failure buffer memory are converted and transferred to the display apparatus. During the time period when the next device is being tested, the failure cell positions of the previously tested device are displayed on the display apparatus.

1 Claim, 6 Drawing Sheets

MEMORY TESTING APPARATUS

BACKGROUND OF THE INVENTION

1. Field of the Invention

The present invention relates to a memory testing apparatus for testing a memory such as, for example, a memory formed by a semiconductor integrated circuit, and more particularly, to such memory testing apparatus provided with means for displaying on a display means locations or addresses of failure memory cells of a memory under test on the basis of the test results.

2. Description of the Related Art

FIG. 4 shows in block diagram a configuration of a conventional memory testing apparatus having a failure data display apparatus added to the memory testing apparatus. In FIG. 4, a reference character MIN denotes a main frame in which the memory testing apparatus is housed, a reference character TSH denotes a test head of the memory testing apparatus, and a reference character WST denotes a controller constructed by a workstation for controlling the entire operation of the main frame MIN.

The memory testing apparatus within the main frame MIN comprises, generally, a pattern generator 11, a logical comparator 12, a failure memory 13 for storing failure data of a memory under test, and a control unit 14. The control unit 14 operates in response to control instructions from the controller WST to control the entire operation of the main frame MIN.

That is, the pattern generator 11 generates a test pattern signal corresponding to a specified type of memory, an address signal, and control signals to apply the test pattern and the address signal, and a device control signal to a device under test DUT (a memory under test in this example) located on the test head TSH.

The test pattern signal is written, in accordance with the address signal and the device control signal having sent to the device under test DUT together with the test pattern signal, in one of the memory cells of the device under test DUT having an address specified by the address signal.

After the writing operation is completed, the pattern generator 11 generates an expected value pattern, an address signal, and a device control signal to input the expected value pattern to the logical comparator 12, where the expected value data is logically compared with the data read out of the device under test DUT. Every time the both data do not accord with each other, the logical comparator 12 generates a failure data having, for example, a logical high level H, which data is written in one memory cell having the same address of the failure memory 13 as that of the device under test DUT at which the failure has occurred.

After the completion of the test, the failure data stored in the failure memory 13 is read out therefrom to the controller WST to display the locations or addresses of the failure memory cells of the memory under test DUT on a display apparatus 21. Specifically, the controller WST has a control unit 22 for controlling the main frame MIN, and the control unit 22 reads the failure data out of the failure memory 13 through the control unit 14 provided in the main frame MIN. The failure data read out of the failure memory 13 is supplied to the controller WST where the locations of the failure memory cells are mapped and displayed on the two-dimensional screen of the display apparatus 21. The display apparatus 21 performs the operations for displaying the failure information as well as for saving the failure information as image data.

FIG. 5 shows a display screen for displaying thereon the failure information. Each section (block) shown in FIG. 5 represents one memory cell of the memory. In FIG. 5, each section indicated by slant lines represents a failure memory cell. Each section is displayed by one dot of the display screen of the display apparatus 21. This image data is stored in an image memory so that the image data can be read out thereof and displayed at any time.

As mentioned above, in the prior art memory testing apparatus, since the failure data is displayed using the controller (workstation) WST for controlling the operation of the main frame MIN, there is a disadvantage that the next testing cannot be performed during the time duration that the controller WST is operating to display the failure data. FIG. 6 shows the time sequence of the prior art memory testing apparatus. As is clear from FIG. 6, each time a test period of a device ends, a failure data display period DSP necessarily succeeds thereto. Specifically, when a test period TEST of a device A ends, the process goes to a failure data display period DSP of the device A during which the test for a next device B cannot be started. As a result, after the failure data display period DSP of the device A has completed, the test for the next device B is started as shown in FIG. 6. Accordingly, there is a drawback in the prior art memory testing apparatus that the test period T of each device becomes long, resulting in low efficiency of the test.

SUMMARY OF THE INVENTION

It is an object of the present invention to provide a memory testing apparatus which is capable of testing a next device immediately after the test of one preceding device has completed.

It is an another object of the present invention to provide a memory testing apparatus which is capable of saving failure information of the one preceding device and displayed it during the time period that the next device is being tested, thereby to carry out the testing of a device and display of failure information thereof within a short period of time.

In order to accomplish the above objects, in one aspect of the present invention, there is provided a memory testing apparatus in which a test pattern is written in a memory under test, the written test pattern is read out to be compared with an expected value, every time the comparison result indicates a disaccord, a failure data is stored in a failure memory for storing failure data, after the completion of the test, the failure data stored in said failure memory are read out to a controller of said memory testing apparatus, and on the basis of the failure data read out to said controller, the locations of failure memory cells are displayed on a display apparatus associated with said controller, said memory testing apparatus further including, separately from said controller, a failure data display controller which comprises: a failure buffer memory for temporarily storing failure data; a failure data transfer path for interconnecting said failure buffer memory and said failure memory; a data converter for converting the failure data stored in said failure buffer memory and for transferring the converted data at high speed; and a display apparatus for receiving the data converted by said data converter to save and display the converted data.

According to the present invention, since the failure data is displayed by the failure data display controller provided separately from the controller for controlling the operation of the main frame, the main frame gets into a free state immediately after the reading operation of the failure data from the failure memory has completed.

Therefore, when all the failure data are transferred to the failure buffer memory and the failure memory goes to a free state, the controller can immediately activate the main frame to start the testing of a next device. In addition, during the time period that the main frame is testing the next device, the data converter can transfer the data stored in the failure buffer memory to the display apparatus at high speed, thereby to display the failure data on the display apparatus and also to save the failure data.

DETAILED DESCRIPTION OF THE PREFERRED EMBODIMENTS

Now, some preferred embodiments of the present invention will be described in detail with reference to FIGS. 1 to 3.

Figure 1:
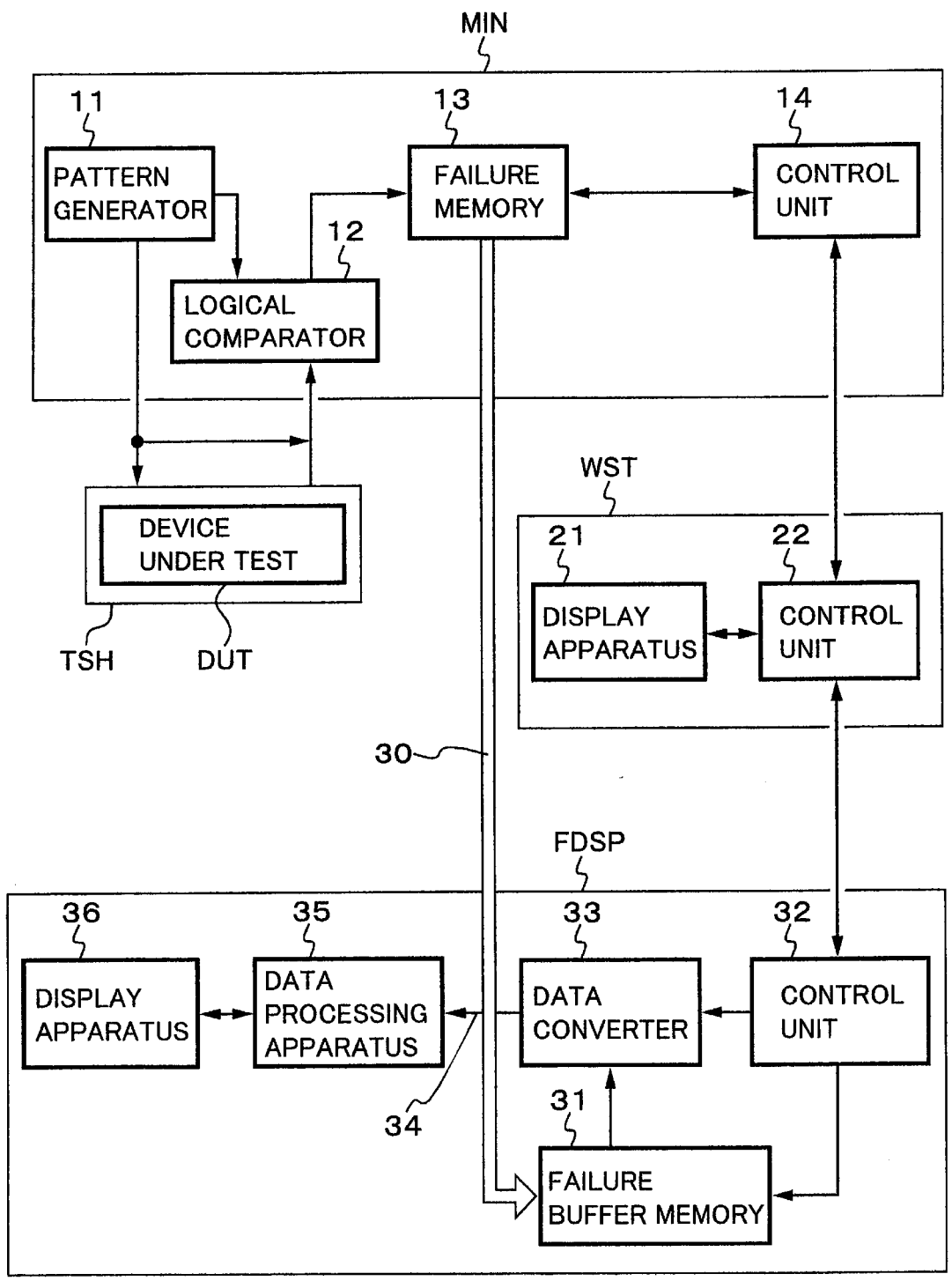
FIG. 1 is a block diagram showing an embodiment of the memory testing apparatus according to the present invention.
Figure 4:
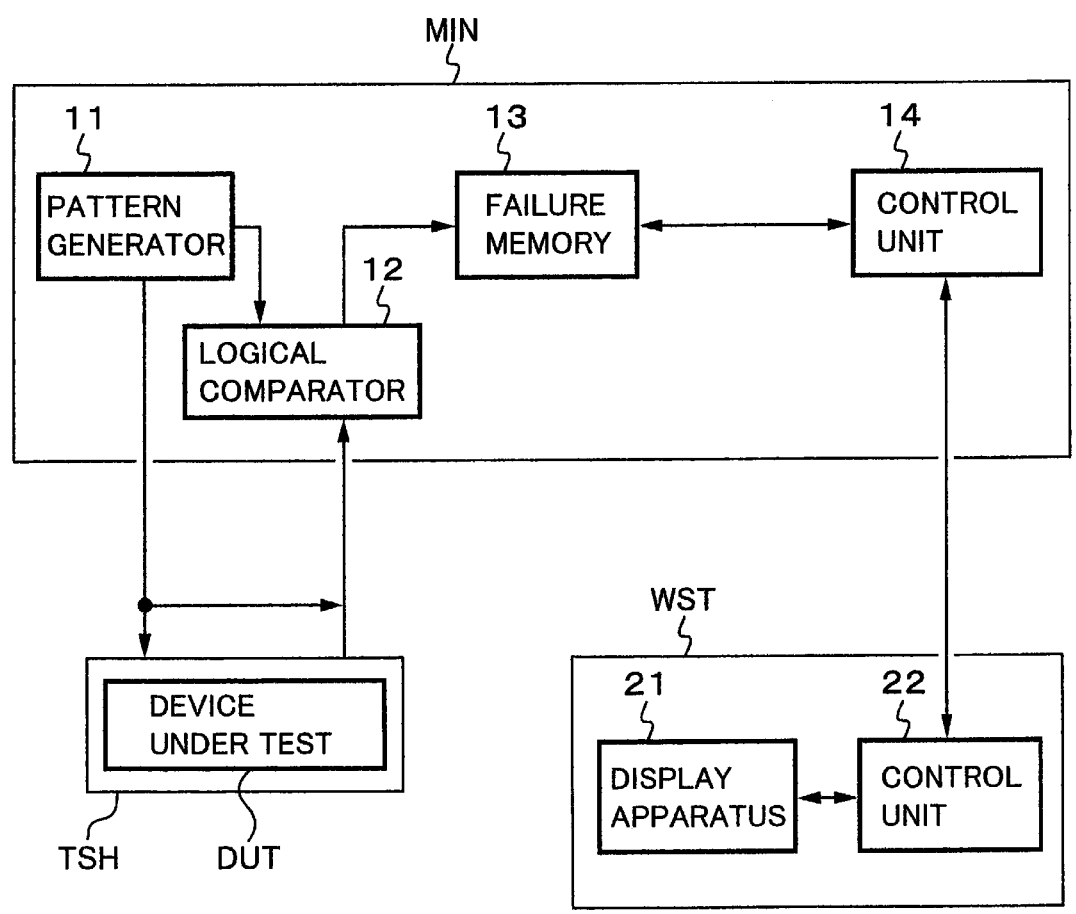
FIG. 4 is a block diagram showing a prior art memory testing apparatus.
Figure 5:
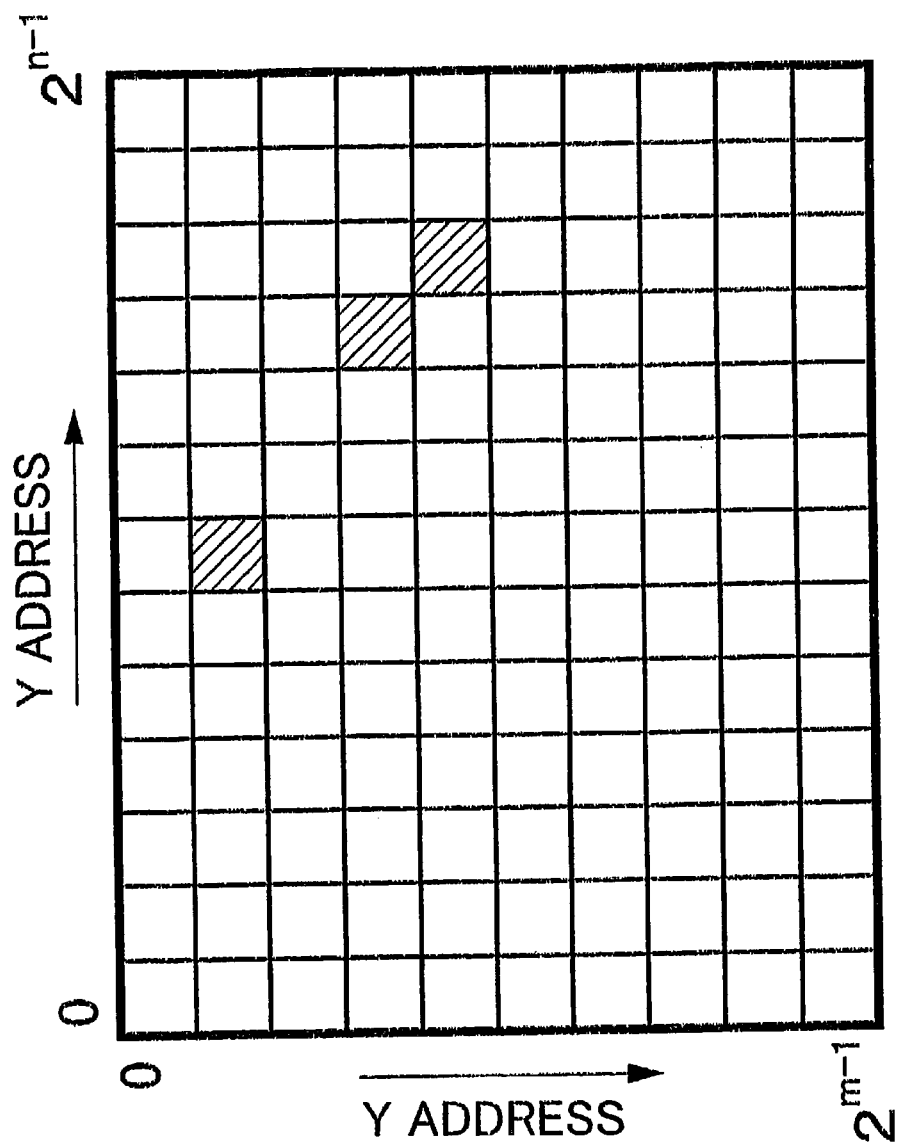
FIG. 5 is an illustration showing a display screen in the prior art memory testing apparatus shown in FIG. 4.
Figure 6:
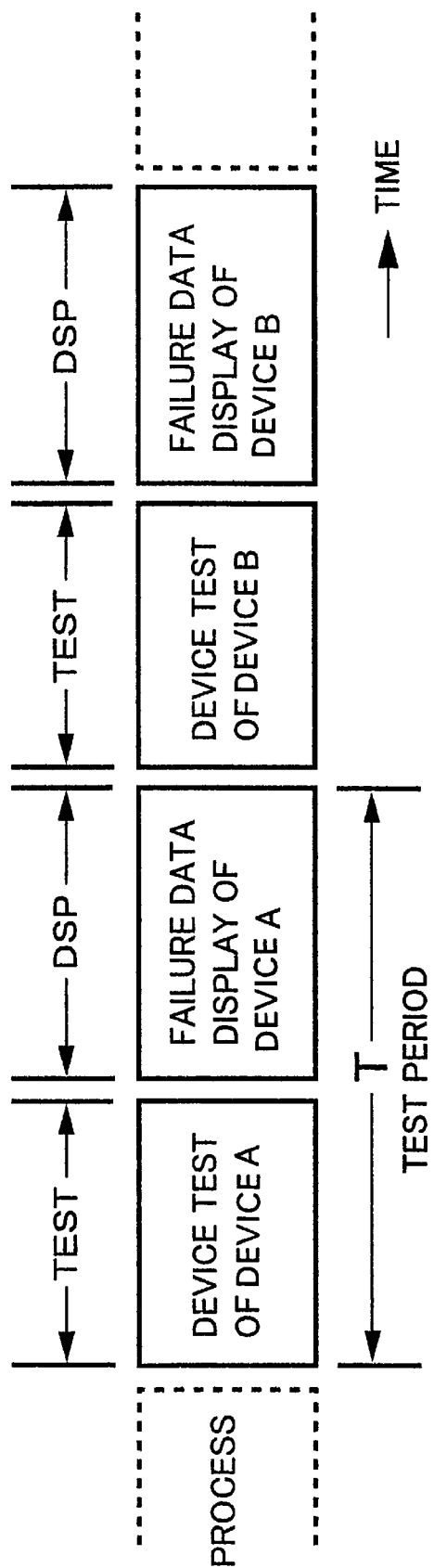
FIG. 6 is a timing chart for explaining the operation of the prior art memory testing apparatus.

FIG. 1 shows in block diagram an embodiment of the memory testing apparatus according to the present invention. Portions and/or elements in FIG. 1 corresponding to those in FIG. 4 have the same reference characters affixed thereto, and the explanation thereof will be omitted unless necessary.

In FIG. 1, the main frame MIN comprises a pattern generator 11, a logical comparator 12, a failure memory 13 for storing failure data, and a control unit 14. As already described with reference to FIG. 4, this main frame MIN is controlled in operation by a controller WST to carry out a test of a device under test DUT located on a test head TSH of the memory testing apparatus.

In the present invention, separately from the controller WST for controlling the operation of the main frame MIN is provided a failure data display controller FDSP. This failure data display controller FDSP comprises a failure buffer memory 31 for temporarily storing failure data, a control unit 32 for controlling the operation of the failure data display controller FDSP, a data converter 33 for converting failure data into compressed data, a data processing apparatus 35 for processing the compressed data, and a display apparatus 36 for displaying failure data processed by the data processing apparatus 35.

Moreover, a failure data transfer path 30 is provided between the failure memory 13 and the failure buffer memory 31. The failure data display controller FDSP is constructed such that the failure data transmitted via the failure data transfer path 30 from the failure memory 13 is tempolarily stored in the failure buffer memory 31, and then the failure data stored therein is converted into compressed data by the data converter 33, and the converted data is supplied through the data processing apparatus 35 to the display apparatus 36, thereby to display the failure memory cells of the memory under test DUT on the display apparatus 36 and also to save the converted data as image data.

According to the present invention, after the completion of the test of the device under test DUT, the control unit 14 activates the failure memory 13 in accordance with a start instruction from the controller WST to cause the failure memory 13 to start a data transfer operation. The failure memory 13 starts to transfer the failure data stored therein to the failure buffer memory 31 via the failure data transfer path 30 to temporarily store the failure data in the failure buffer memory 31. When the operation of failure data transfer is completed, the controller WST issues a test start instruction to the main frame MIN to start the test of a next device.

During the time period that the main frame MIN is testing the next device, the failure data display controller FDSP sends a start instruction to the data converter 33 to perform a data conversion of the failure data stored in the failure buffer memory 31. This data conversion is a process for converting a time series of data (for example, a compression conversion) in order to efficiently transfer data so that a large amount of data can be transferred in a short period of time.

The data converted by the data converter 33 is transferred to the data processing apparatus 35 via the data transfer path 34 to be saved therein as image data. After the data saving, the data processing apparatus 35 reads the image data therefrom and supplies it to the display apparatus 36 to display thereon the locations or addresses of the failure memory cells of the memory under test DUT as an image.

Figure 2:
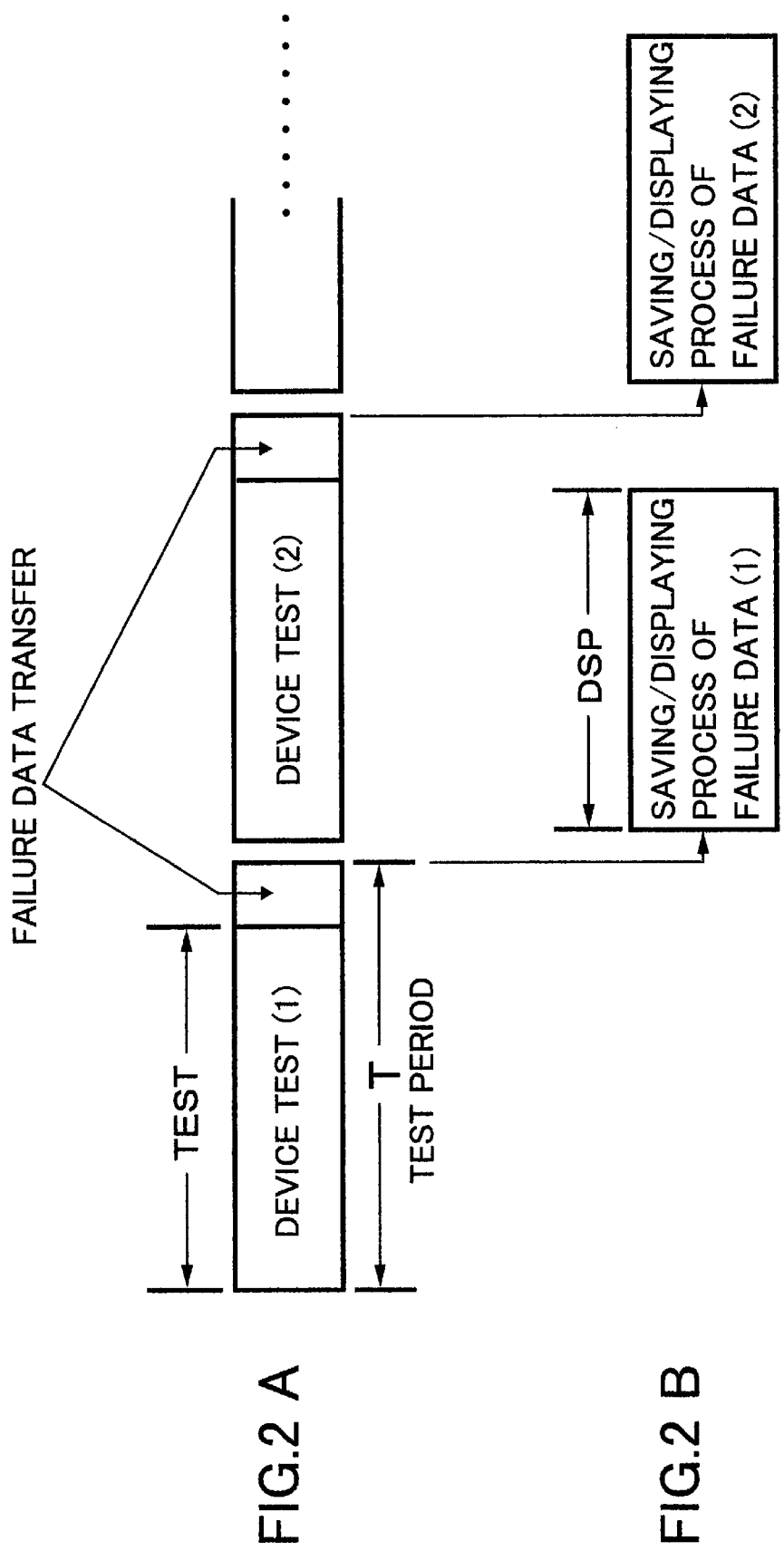
FIG. 2 is a timing chart for explaining the operation of the memory testing apparatus shown in FIG. 1.

FIG. 2 is a timing chart for explaining the operation of the memory testing apparatus constructed as shown in FIG. 1. As shown in FIG. 2A, when a device test (1) is completed, a data transfer of the failure data (1) is carried out. When the data transfer of the failure data (1) is completed, the failure data display controller FDSP performs, as shown in FIG. 2B, the processes of saving and displaying of the failure data (1). Therefore, during the time period when the main frame MIN is performing a device test (2), the failure data display controller FDSP saves and displays the result of the device test (1). Consequently, the test period T can be reduced to approximately ½ of that in the prior art memory testing apparatus.

Figure 3:
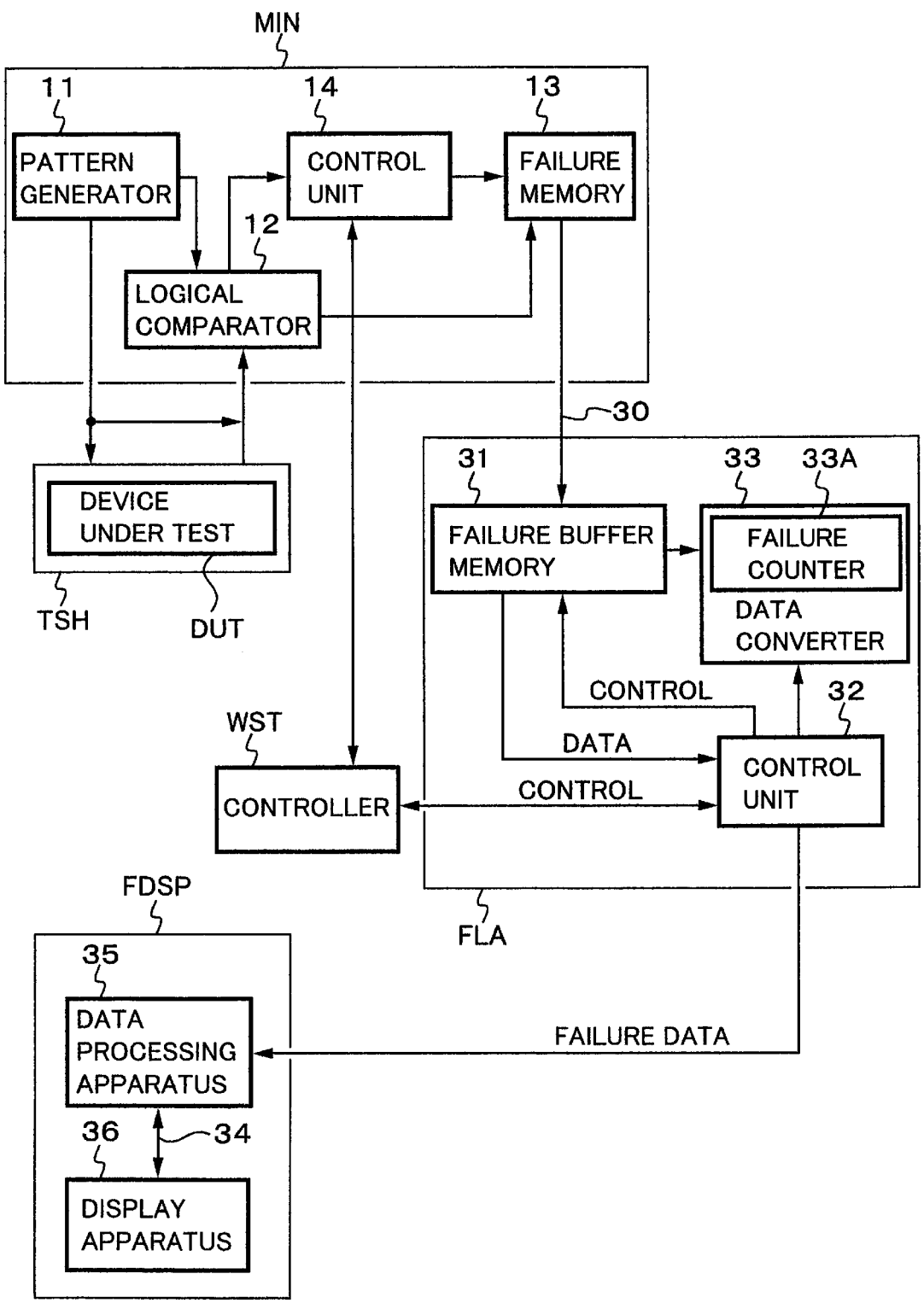
FIG. 3 is a block diagram showing an another embodiment of the memory testing apparatus according to the present invention.

FIG. 3 shows an another embodiment of the present invention.

This embodiment is a case where the present invention is applied to a memory testing apparatus having a relief address analyzing apparatus FLA. The failure data transferred to the failure buffer memory 31 is sent out to the failure data converter 33 and at the same time the number of failure memory cells is counted by a failure counter 33A provided in the data converter 33. Whether or not the tested device can be relieved by relief cells is determined based on the number of failure memory cells.

The data converter 33 sends the failure data to the failure data display controller FDSP via the control unit 32 so that the failure data display controller FDSP displays the locations or addresses of the failure memory cells of the memory under test DUT.

As explained above, according to the present invention, immediately after the failure data having been stored, during the device test, in the failure memory 13 are transferred to the failure buffer memory 31, the main frame MIN can start the test of the next device. Also, during the time period when the main frame MIN is testing the next device, the failure data display controller FDSP can display the positions of the failure memory cells. As a result, since a test can be performed repeatedly in a shorter period than the period of alternately repeating the test operation and the display operation, there is an advantage that many devices can be tested in a short period of time.

While the present invention has been described with regard to the preferred embodiments shown by way of examples, it will be clear to those skilled in the art that various modifications, changes, and/or improvements of the embodiments can be made without departing from the spirit and the scope of the present invention. Accordingly, the present invention is not limited to the embodiments shown and described above, and is intended to include such various inventions defined by the appended claims.

What is claimed is:

1. A memory testing apparatus in which a test pattern is written in a memory under test, the written test pattern is read out to be compared with an expected value, every time the comparison result indicates a disaccord, a failure data is stored in a failure memory for storing failure data, after the completion of the test, the failure data stored in said failure memory are read out to a controller of said memory testing apparatus, and on the basis of the failure data read out to said controller, the locations of failure memory cells are displayed on a display apparatus associated with said controller, said memory testing apparatus further including, separately from said controller, a failure data display controller which comprises:

- a failure buffer memory for temporarily storing failure data;
- a failure data transfer path for interconnecting said failure buffer memory and said failure memory;
- a data converter for converting the failure data stored in said failure buffer memory and for transferring the converted data at high speed; and
- a display apparatus for receiving the data converted by said data converter to save and display the converted data.

* * * * *